United States Patent
Wang et al.

(10) Patent No.: US 12,088,323 B2
(45) Date of Patent: Sep. 10, 2024

(54) READ-WRITE METHOD AND APPARATUS FOR LEPS SOFT DECODING ESTIMATION, AND ELECTRONIC DEVICE

(71) Applicant: INSTITUTE OF MICROELECTRONICS, CHINESE ACADEMY OF SCIENCES, Beijing (CN)

(72) Inventors: Qi Wang, Beijing (CN); Yiyang Jiang, Beijing (CN); Qianhui Li, Beijing (CN); Zongliang Huo, Beijing (CN); Tianchun Ye, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 18/254,377

(22) PCT Filed: Nov. 25, 2020

(86) PCT No.: PCT/CN2020/131483
§ 371 (c)(1),
(2) Date: May 24, 2023

(87) PCT Pub. No.: WO2022/109872
PCT Pub. Date: Jun. 2, 2022

(65) Prior Publication Data
US 2024/0038318 A1    Feb. 1, 2024

(51) Int. Cl.
*H03M 13/39*    (2006.01)
*G11C 29/12*    (2006.01)
(Continued)

(52) U.S. Cl.
CPC ..... *H03M 13/3905* (2013.01); *G11C 29/1201* (2013.01); *G11C 29/42* (2013.01); *G11C 29/46* (2013.01)

(58) Field of Classification Search
CPC . H03M 13/3905; G11C 29/1201; G11C 29/42
See application file for complete search history.

(56) References Cited

U.S. PATENT DOCUMENTS 10,884,855 B1 * 1/2021 Yazovitsky ......... G11C 11/4074
2014/0281762 A1    9/2014 Norrie
(Continued)

FOREIGN PATENT DOCUMENTS

| CN | 108809330 A | 11/2018 |
| CN | 111429959 A | 7/2020 |
| CN | 111863088 A | 10/2020 |

OTHER PUBLICATIONS

International Search Report and Written Opinion dated May 8, 2021, for corresponding PCT Application No. PCT/CN2020/131483.

*Primary Examiner* — Joseph D Torres
(74) *Attorney, Agent, or Firm* — Kinney & Lange, P.A.

(57) ABSTRACT

A read-write method includes: sequentially writing, in a first direction, a code word obtained by information-bit encoding into a target memory cell in each layer of memory cell array in the three-dimensional memory; randomly reading the target memory cell in each layer of memory cell array, or sequentially reading the target memory cell in each layer of memory cell array in a second direction; and determining an LLR value of a current target memory cell according to a storage time corresponding to the current target memory cell when reading, a threshold voltage partition corresponding to the current target memory cell when reading, a comprehensive distribution state corresponding to the current target memory cell when reading, and a pre-established LLR table, (Continued)

so as to perform a soft decoding operation on the code word in the current target memory cell based on the LLR value of the current target memory cell.

10 Claims, 10 Drawing Sheets

(51) Int. Cl.
　　　*G11C 29/42*　　(2006.01)
　　　*G11C 29/46*　　(2006.01)

(56) References Cited

U.S. PATENT DOCUMENTS

| | | |
|---|---|---|
| 2019/0081641 A1 | 3/2019 | Symons et al. |
| 2019/0370111 A1* | 12/2019 | Barbato ................. G11C 29/42 |
| 2020/0293398 A1 | 9/2020 | Symons et al. |

* cited by examiner

READ-WRITE METHOD AND APPARATUS FOR LEPS SOFT DECODING ESTIMATION, AND ELECTRONIC DEVICE

CROSS-REFERENCE TO RELATED APPLICATION

This application is a Section 371 National Stage Application of International Application No. PCT/CN2020/131483, filed on Nov. 25, 2020, entitled "READ-WRITE METHOD AND APPARATUS FOR LEPS SOFT DECODING ESTIMATION, AND ELECTRONIC DEVICE", the content of which is hereby incorporated by reference in its entirety.

TECHNICAL FIELD

The present disclosure pertains to a field of encoding and decoding technologies of a memory, and relates to a read-write method and apparatus for an LEPS soft decoding estimation and an electronic device.

BACKGROUND

There are various types of non-volatile memories, such as read-only memory (ROM), programmable read-only memory (PROM), electrically alterable read-only memory (EAROM), erasable programmable read-only memory (EPROM), electrically erasable programmable read-only memory (EEPROM), and flash memory, etc. When storing an information in a non-volatile memory, it is required to encode data and write the encoded data into a memory cell in a memory cell array. When reading, it is required to perform a decoding operation.

When LDPC soft decoding is adopted by an existing non-volatile memory, generally speaking, for a single-level cell (SLC) flash memory, there are two distribution states along a threshold voltage distribution, and there is an overlap between the two distribution states. Each overlap is read three times, and the read data is divided into four regions along the threshold voltage distribution. Different regions correspond to different LLR values, and an expression for LLR is: $LLR=Log(P_0/P_1)$, where $P_0$ represents a probability of logic 0, and $P_1$ represents a probability of logic 1. Different LLR values reflect different confidence and reliability. The higher the LLR value, the higher the probability that 0 is read from the region. The above-mentioned LDPC soft decoding method is also applicable to a two-level cell (MLC) flash memory and a three-level cell (TLC) flash memory, with a difference that the MLC has $2^2=4$ distribution states along the threshold voltage distribution, and the TLC has $2^3=8$ distribution states along the threshold voltage distribution. In an LDPC algorithm, an algorithm for estimating the LLR value is a distribution-based LLR estimation method LEPS. However, there is still a need to improve an estimation ability of the LLR value to improve an error correction ability of the LDPC soft decoding and reduce a bit error rate and a number of iterations.

SUMMARY

In view of the above, the embodiments of the present disclosure provide a read-write method and apparatus for an LEPS soft decoding estimation and an electronic device, so as to improve at least an error correction performance.

In an aspect of the present disclosure, a read-write method for an LEPS soft decoding estimation is provided. The read-write method is applicable to a three-dimensional memory; the three-dimensional memory includes: a plurality of vertical channel structures arranged perpendicular to a substrate, and a plurality of layers of memory cell arrays intersecting with the plurality of vertical channel structures and arranged parallel to each other, wherein a memory cell in an upper layer of memory cell array and a memory cell at a corresponding position in a lower layer of memory cell array are connected to a same vertical channel structure. The read-write method for the LEPS soft decoding estimation includes: sequentially writing, in a first direction, a code word obtained by information-bit encoding into a target memory cell in each layer of memory cell array in the three-dimensional memory, wherein the first direction includes a bottom-up direction or a top-down direction; randomly reading the target memory cell in each layer of memory cell array, or sequentially reading the target memory cell in each layer of memory cell array in a second direction, wherein the second direction is identical with or opposite to the first direction; and determining an LLR value of a current target memory cell according to a storage time corresponding to the current target memory cell when reading, a threshold voltage partition corresponding to the current target memory cell when reading, a comprehensive distribution state corresponding to the current target memory cell when reading, and a pre-established LLR table, so as to perform a soft decoding operation on the code word in the current target memory cell based on the LLR value of the current target memory cell. The comprehensive distribution state of the current target memory cell is determined according to an influence of a reference memory cell corresponding to the same vertical channel structure as the current target memory cell on a distribution state of the current target memory cell. When the target memory cell in each layer of memory cell array is randomly read, the reference memory cell is determined according to the first direction. When the target memory cell in each layer of memory cell array is sequentially read in the second direction, the reference memory cell is determined according to the first direction and the second direction. An input of the pre-established LLR table includes the storage time, the threshold voltage partition and the comprehensive distribution state, and an output of the pre-established LLR table is the LLR value.

According to the embodiments of the present disclosure, the determining the reference memory cell according to the first direction and the second direction includes: determining a memory cell in a next layer of memory cell array adjacent to the current target memory cell in the second direction as the reference memory cell when the second direction is identical with the first direction.

According to the embodiments of the present disclosure, the determining the reference memory cell according to the first direction and the second direction includes: determining a memory cell in a previous layer of memory cell array adjacent to the current target memory cell in the second direction as the reference memory cell when the second direction is opposite to the first direction.

According to the embodiments of the present disclosure, the determining the reference memory cell according to the first direction and the second direction includes: determining a memory cell in a previous layer of memory cell array adjacent to the current target memory cell in the second direction and a memory cell in a next layer of memory cell array adjacent to the current target memory cell in the second direction as the reference memory cell when the second direction is opposite to the first direction.

According to the embodiments of the present disclosure, the determining the reference memory cell according to the first direction and the second direction includes: determining a memory cell in a previous layer of memory cell array adjacent to the current target memory cell in the second direction as the reference memory cell when the second direction is identical with the first direction.

According to the embodiments of the present disclosure, the determining the reference memory cell according to the first direction includes: determining a memory cell in a next layer of memory cell array adjacent to the current target memory cell in the first direction as the reference memory cell.

According to the embodiments of the present disclosure, the determining the reference memory cell according to the first direction includes: determining a memory cell in a next layer of memory cell array adjacent to the current target memory cell in the first direction and a memory cell in a previous layer of memory cell array adjacent to the current target memory cell in the first direction as the reference memory cell.

According to the embodiments of the present disclosure, the LLR table is pre-established by: performing a read test on a memory to: acquire, at a specified storage time, a threshold voltage distribution and a distribution state of the current target memory cell of which an exact code is known and a threshold voltage distribution and a distribution state of a memory cell adjacent to the current target memory cell, determine a comprehensive distribution state of the current target memory cell according to an influence of the memory cell adjacent to the current memory cell on the distribution state of the current target memory cell, and calculate LLR values of different threshold voltage partitions according to the comprehensive distribution state; and acquiring corresponding threshold voltage partitions and comprehensive distribution states at different storage times, so as to obtain the LLR table of which the input includes the storage time, the threshold voltage partition and the comprehensive distribution state and the output is the LLR value.

In another aspect of the present disclosure, a read-write apparatus for an LEPS soft decoding estimation is provided. The read-write apparatus is configured to perform a read-write operation on a three-dimensional memory. The three-dimensional memory includes: a plurality of vertical channel structures arranged perpendicular to a substrate, and a plurality of layers of memory cell arrays intersecting with the plurality of vertical channel structures and arranged parallel to each other, wherein a memory cell in an upper layer of memory cell array and a memory cell at a corresponding position in a lower layer of memory cell array are connected to a same vertical channel structure. The read-write apparatus includes: a writing module configured to sequentially write, in a first direction, a code word obtained by information-bit encoding into a target memory cell in each layer of memory cell array in the three-dimensional memory, wherein the first direction includes a bottom-up direction or a top-down direction; a reading module configured to randomly read the target memory cell in each layer of memory cell array, or sequentially read the target memory cell in each layer of memory cell array in a second direction, wherein the second direction is identical with or opposite to the first direction; and an LLR value determination unit configured to determine an LLR value of a current target memory cell according to a storage time corresponding to the current target memory cell when reading, a threshold voltage partition corresponding to the current target memory cell when reading, a comprehensive distribution state corresponding to the current target memory cell when reading, and a pre-established LLR table, so as to perform a soft decoding operation on the code word in the current target memory cell based on the LLR value of the current target memory cell. The comprehensive distribution state of the current target memory cell is determined according to an influence of a reference memory cell corresponding to the same vertical channel structure as the current target memory cell on a distribution state of the current target memory cell. When the target memory cell in each layer of memory cell array is randomly read, the reference memory cell is determined according to the first direction. When the target memory cell in each layer of memory cell array is sequentially read in the second direction, the reference memory cell is determined according to the first direction and the second direction. An input of the pre-established LLR table includes the storage time, the threshold voltage partition and the comprehensive distribution state, and an output of the pre-established LLR table is the LLR value.

In another aspect of the present disclosure, an electronic device is provided. The electronic device includes: one or more processors; and a storage means configured to store one or more programs. The one or more programs are configured to, when being executed by the one or more processors, cause the one or more processors to implement the read-write method described above.

DETAILED DESCRIPTION OF EMBODIMENTS

Considering an influence, such as a lateral diffusion effect or a capacitive coupling effect, etc. of an adjacent memory cell on a distribution state of a current memory cell, it is proposed to represent the distribution state of the current memory cell by using a comprehensive distribution state obtained based on the influence of the adjacent memory cell, and determine an LLR value in each partition for decoding based on the comprehensive distribution state. In a process of implementing technical concepts of the present disclosure, the inventor further found the following technical problems: an influence of different writing and reading manners of the memory on the comprehensive distribution state is not taken into account; when reading, if a memory cell in an upper physical page adjacent to a physical page where the current target memory cell is located acts as a reference cell, and the memory cell on the upper physical page has not been read, that is, it has not been decoded, then there is a need to determine whether an error of the reference cell may cause a decoding error and how to ensure a high error-correction ability of the soft decoding.

In view of this, the embodiments of the present disclosure provide a read-write method and apparatus for an LEPS soft decoding estimation and an electronic device, in which an influence of a writing order and a reading order is taken into account when selecting the reference memory cell, and the reference memory cell is determined based on the wiring order and the reading manner, so as to obtain the LLR value corresponding to the comprehensive distribution state of the currently read memory cell to perform a soft decoding operation based on the influence of the above-mentioned reference memory cell, thereby improving the error correction ability and reducing the number of iterations; in addition, a trade-off may be made between an error correction ability, a read/write efficiency and a memory occupation, so as to improve an overall performance of the memory.

In order to make objectives, technical solutions and advantages of the present disclosure clearer, the present disclosure will be further described in detail below in conjunction with specific embodiments and with reference to the accompanying drawings.

A first exemplary embodiment of the present disclosure provides a read-write method for an LEPS soft decoding estimation. The read-write method is applicable to a three-dimensional memory.

Figure 1:
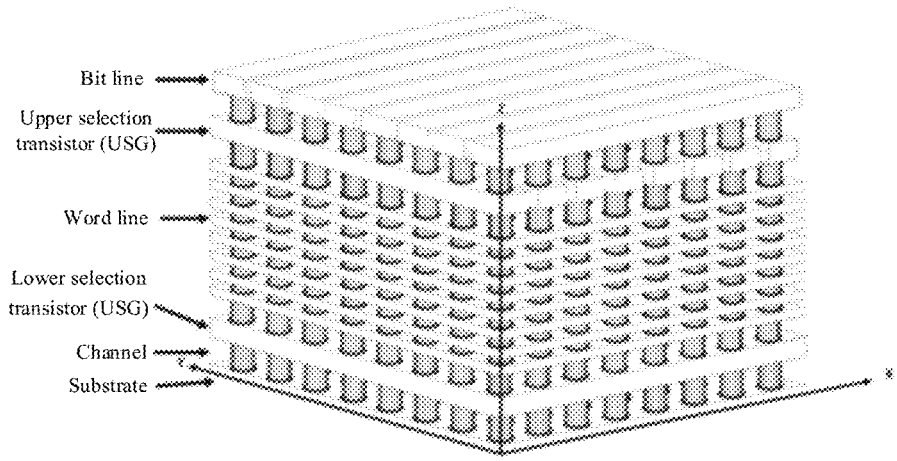
FIG. 1 shows a schematic structural diagram of a three-dimensional memory according to an embodiment of the present disclosure.

FIG. 1 shows a schematic structural diagram of a three-dimensional memory according to an embodiment of the present disclosure.

The three-dimensional memory of the present disclosure includes: a plurality of vertical channel structures arranged perpendicular to a substrate, and a plurality of layers of memory cell arrays intersecting with the plurality of vertical channel structures and arranged parallel to each other. A memory cell in an upper layer of memory cell array and a memory cell at a corresponding position in a lower layer of memory cell array are connected to a same vertical channel structure.

Referring to FIG. 1, a three-dimensional charge trap NAND Flash block is illustrated. Each layer of memory cell array is a physical page. Adjacent memory cells in a same channel have the same x coordinate and y coordinate but different z coordinates, that is, the adjacent memory cells in the same channel are located on different physical pages. In SLC, MLC and TLC, a physical page and a logical page have a relationship of physical page=i×logical page, where for SLC, i=1, for MLC, i=2, and for TLC, i=3. Therefore, in a related art, when binary coding is adopted, SLC has $2^1=2$ distribution states, MLC has $2^2=4$ distribution states, and TLC has $2^3=8$ distribution states. In a process of reading the memory cell arrays, each physical layer may be read sequentially from bottom to top according to a word line (WL). In the present disclosure, adjacent three physical layers are respectively referred to as a lower physical page (Lower Page), a middle physical page (Middle Page) and an upper physical page (Upper Page) according to an extension direction of the word line (i.e., z direction).

Figure 2:
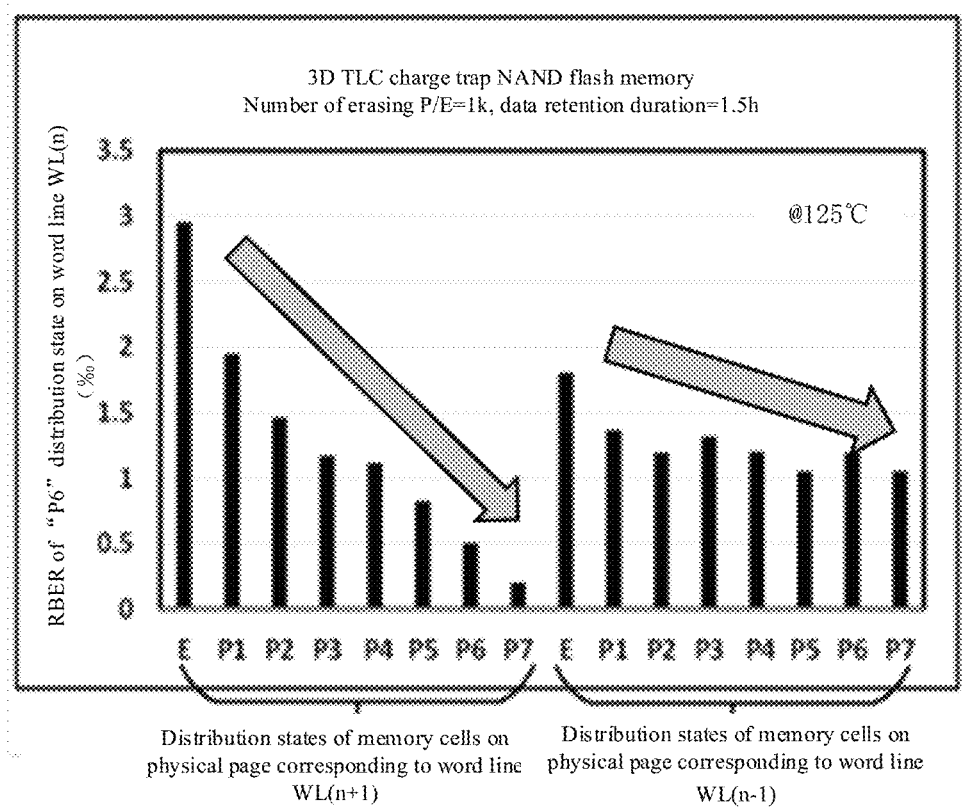
FIG. 2 shows an exemplary experimental result of a 3D charge trap NAND flash memory according to an embodiment of the present disclosure.

FIG. 2 shows an exemplary experimental result of a 3D charge trap NAND flash memory according to an embodiment of the present disclosure. Taking a three-dimensional TLC flash memory as an example, the physical page where a current memory cell is located corresponds to a word line WL(n). FIG. 2 shows a change in a raw bit error rate (RBER) of a distribution state P6 of the current memory cell with different distribution states on an adjacent physical page. The influence of the distribution states E, $P_1$, $P_2$, $P_3$, $P_4$, $P_5$, $P_6$ and $P_7$ of the memory cell adjacent to the current memory cell located on the physical page corresponding to the word line WL(n+1) on the RBER of the distribution state of the current memory cell has a greater trend than the influence of the distribution states E, $P_1$, $P_2$, $P_3$, $P_4$, $P_5$, $P_6$ and $P_7$ of the memory cell adjacent to the current memory cell located on the physical page corresponding to the word line WL(n−1) on the RBER of the distribution state of the current memory cell, as shown by two arrows in FIG. 2. In that experiment, the influence of the reading order and writing order on the comprehensive distribution state is considered; the reading order is consistent with the writing order, and a method of writing sequentially from bottom to top and reading sequentially from bottom to top is adopted, then the influence of the memory cell on the upper physical page on the distribution state of the current memory cell is greater than the influence of the memory cell on the lower physical page on the distribution state of the current memory cell.

A series of experiments on the reading order and writing order were further conducted based on the above contents. It was found that: the writing order determines a degree of influence of an adjacent memory cell on the current memory cell located on the word line $WL_n$. When writing in a normal sequence (from bottom to top), the degree of influence of the adjacent memory cell located on the word line $WL_{n+1}$ on the current memory cell is greater than the degree of influence of the adjacent memory cell located on the word line $WL_{n-1}$ on the current memory cell. When writing in a reverse sequence (from top to bottom), the degree of influence of the adjacent memory cell located on the word line $WL_{n-1}$ on the current memory cell is greater than the degree of influence of the adjacent memory cell located on the word line $WL_{n+1}$ on the current memory cell.

In view of the above findings, the following strategy is adopted by the present disclosure: when the reading order is consistent with the writing order, if a reference memory cell on one side is selected, that is, in a case of "referring to one side", it is recommended to use an adjacent memory cell on a side having a greater influence (for example, in the case of writing in a normal sequence, the adjacent memory cell located on the word line $WL_{n+1}$) as the reference memory cell. Although the adjacent memory cell having a greater influence has not been decoded when it is used as the reference memory cell, compared with the influence of a possible error of the above-mentioned adjacent memory cell on the error correction ability of the current memory cell, a positive effect brought by the comprehensive distribution state of the current memory cell obtained by using the above-mentioned adjacent reference cell having a greater influence may overall improve the decoding error correction ability of the current memory cell, which may refer to experimental results shown in FIG. 16 to FIG. 18. When the reading order is opposite to the writing order, if the reference memory cell on one side is selected, it is needed to preferentially ensure that the data of the reference page is correct, that is, a decoded adjacent memory cell is used as the reference memory cell to improve the error correction ability of soft decoding. When the reading order is opposite to the writing order, it is also possible to adopt a method of "referring to both sides" to select the adjacent memory cells on both sides of the current memory cell as the reference memory cells. Such solution may help to further improve the error correction ability and reduce the number of iterations. In addition, in the case of referring to one side, when the reading order is consistent with the writing order, the adjacent memory cell on the side having a less influence (for example, when writing in a normal sequence, the adjacent memory cell located on $WL_{n-1}$) may be used as the reference. In that solution, the reference memory cell has been decoded in advance, and an accuracy of the reference memory cell may be ensured. The error correction ability of that solution is lower than the error correction ability of the solution of referring to the adjacent memory cell on the side having a greater influence, but it is still equal to or slightly superior to the error correction ability of a traditional error correction algorithm for an LLR estimation. In addition to the solution of sequentially reading, it is also possible to adopt a solution of randomly reading. When randomly reading, the adjacent memory cell(s) on one side or both sides may be used as the reference memory cell; in the case of referring to one side, it is recommended to use the adjacent memory cell on the side having a greater influence as the reference memory cell.

In addition, it should be noted that in the case of sequentially reading, since the data of the adjacent layer for reference has been prefetched or has been read, no additional reading cost is required, so that the reading and writing efficiency may be improved, and a memory consumption may be reduced while ensuring the improvement of error correction performance.

The read-write method for the LEPS soft decoding estimation of the present disclosure will be described below in conjunction with specific embodiments.

Figure 3:
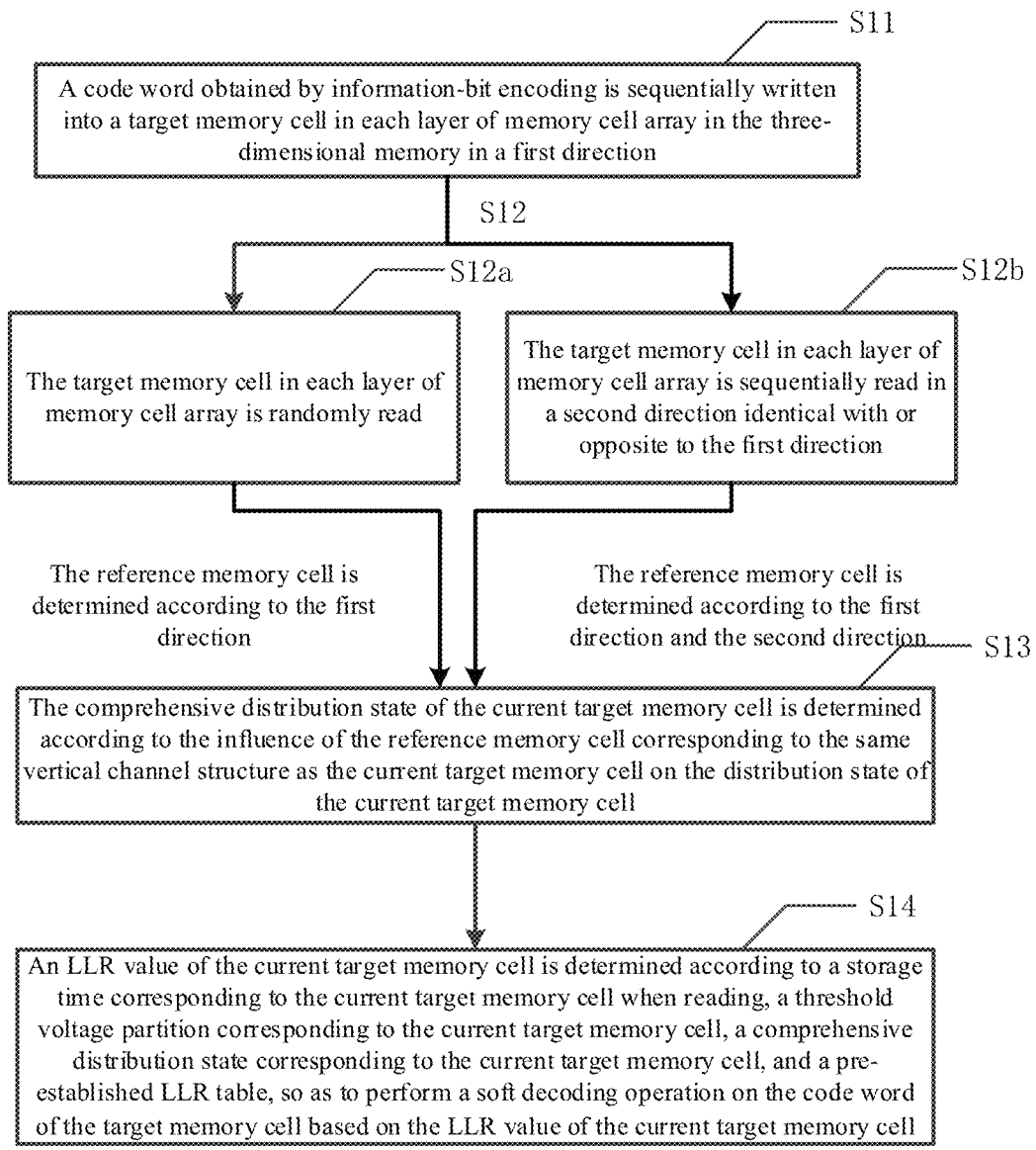
FIG. 3 shows a flowchart of a read-write method for an LEPS soft decoding estimation according to an embodiment of the present disclosure.

FIG. 3 shows a flowchart of a read-write method for an LEPS soft decoding estimation according to an embodiment of the present disclosure.

Referring to FIG. 3, the read-write method for the LEPS soft decoding estimation of the present disclosure includes steps S11, S12 and S14.

In step S11, a code word obtained by information-bit encoding is sequentially written into a target memory cell in each layer of memory cell array in the three-dimensional memory in a first direction. The first direction includes a bottom-up direction or a top-down direction.

In an embodiment, an information bit may be encoded by Gray code to obtain a code word, and the code word may be written into the target memory cell of the memory.

In step S12, the target memory cell in each layer of memory cell array is randomly read, or the target memory cell in each layer of memory cell array is sequentially read in a second direction. The second direction is identical with or opposite to the first direction. In FIG. 3, the operation of randomly reading the target memory cell in each layer of memory cell array is shown in S12a; the operation of sequentially reading the target memory cell in each layer of memory cell array in the second direction is shown in S12b.

In step S14, an LLR value of the current target memory cell is determined according to a storage time corresponding to the current target memory cell when reading, a threshold voltage partition corresponding to the current target memory cell when reading, a comprehensive distribution state corresponding to the current target memory cell when reading, and a pre-established LLR table, so as to perform a soft decoding operation on the code word of the target memory cell based on the LLR value of the current target memory cell.

Referring to FIG. 3, the above-mentioned read-write method further includes step S13, in which the comprehensive distribution state of the current target memory cell is determined according to the influence of the reference memory cell corresponding to the same vertical channel structure as the current target memory cell on the distribution state of the current target memory cell.

When the target memory cell in each layer of memory cell array is randomly read, the reference memory cell is determined according to the first direction.

When the target memory cell in each layer of memory cell array is sequentially read in the second direction, the reference memory cell is determined according to the first direction and the second direction.

An input of the above-mentioned pre-established LLR table includes the storage time, the threshold voltage partition and the comprehensive distribution state, and an output of the pre-established LLR table is the LLR value.

According to the embodiments of the present disclosure, the input of the above-mentioned LLR table further includes a number of erasure and writing (P/E cycle).

According to the embodiments of the present disclosure, the method of pre-establishing the LLR table includes: performing a read test on the memory, and at a specific storage time, acquiring a threshold voltage distribution and a distribution state of a current target memory cell of which an exact code is known and a threshold voltage distribution and a distribution state of a memory cell adjacent to the current target memory cell, determining a comprehensive distribution state of the current target memory cell according to the influence of the memory cell adjacent to the current target memory cell on the distribution state of the current target memory cell, and calculating the LLR values of different threshold voltage partitions according to the comprehensive distribution state; and acquiring the corresponding threshold voltage partitions and comprehensive distribution states at different storage times, so as to obtain the LLR table of which the input includes the storage time, the threshold voltage partition and the comprehensive distribution state and the output is the LLR value. The "memory cell adjacent to the current target memory cell" here refers to a memory cell in a surrounding environment of a radiation with the current target memory cell as a starting point, including a memory cell immediately adjacent to the current memory cell (not separated by other memory cells), a memory cell next-nearest adjacent to the current memory cell, a memory cell after the next-nearest adjacent memory cell, etc.

The solution of determining the reference memory cell when reading in the normal sequence will be described exemplarily below with reference to FIG. 4 to FIG. 11.

According to the embodiments of the present disclosure, in the case of "referring to one side", it is recommended to use the adjacent memory cell on the side having a greater influence as the reference. Determining the reference memory cell according to the first direction and the second direction includes: determining a memory cell in a next layer of memory cell array adjacent to the current target memory cell in the second direction as the reference memory cell when the second direction is identical with the first direction.

Figure 4:
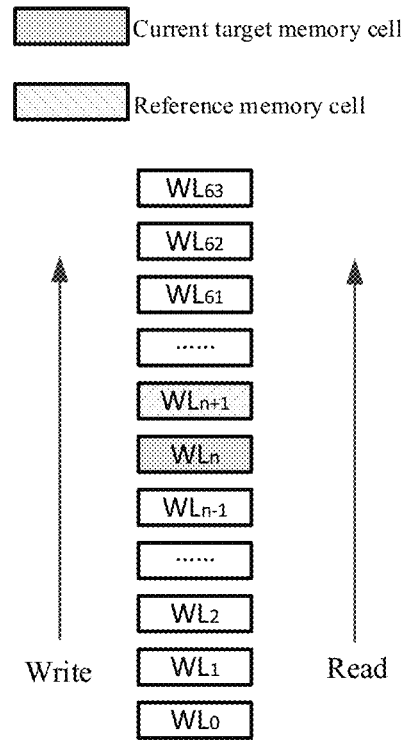
FIG. 4 shows an exemplary solution of determining a reference memory cell according to a first direction and a second direction when the first direction is identical with the second direction according to an embodiment of the present disclosure.

FIG. 4 shows an exemplary solution of determining the reference memory cell according to the first direction and the second direction when the first direction is identical with the second direction according to an embodiment of the present disclosure.

Referring to FIG. 4, when the first direction is a bottom-up direction, if the second direction is identical with the first direction, the word line where the current target memory cell is located is $WL_n$, and the reference memory cell is a memory cell corresponding to the same vertical channel structure (e.g., trench) as the current target memory cell on the word line $WL_{n+1}$.

Figure 5:
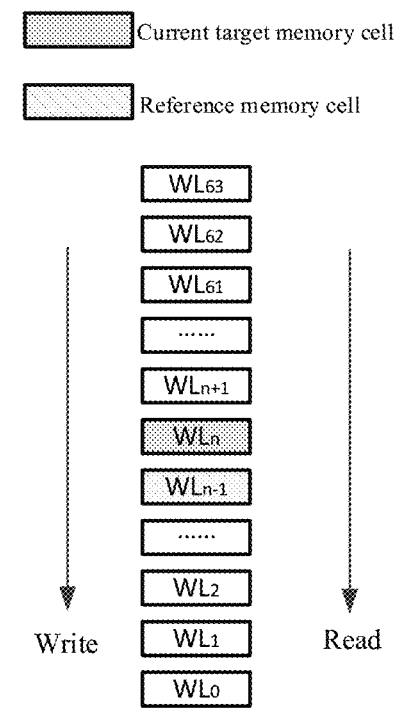
FIG. 5 shows another exemplary solution of determining the reference memory cell according to the first direction and the second direction when the first direction is identical with the second direction according to an embodiment of the present disclosure.

FIG. 5 shows another exemplary solution of determining the reference memory cell according to the first direction and the second direction when the first direction is identical with the second direction according to an embodiment of the present disclosure.

Referring to FIG. 5, when the first direction is a top-down direction, if the second direction is identical with the first direction, the word line where the current target memory cell is located is $WL_n$, and the reference memory cell is a memory cell corresponding to the same vertical channel structure (e.g., trench) as the current target memory cell on the word line $WL_{n-1}$.

According to the embodiments of the present disclosure, when the reading order is opposite to the writing order, if the reference memory cell on one side is selected, it is needed to preferentially ensure that the data on the reference page is correct, that is, a decoded adjacent memory cell is used as the reference memory cell, so as to improve the error correction ability of soft decoding. Determining the reference memory cell according to the first direction and the second direction includes: determining a memory cell in a previous layer of memory cell array adjacent to the current target memory cell in the second direction as the reference memory cell when the second direction is opposite to the first direction.

Figure 6:
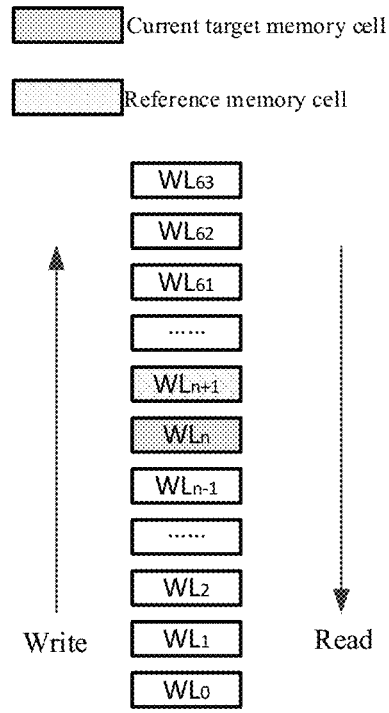
FIG. 6 shows an exemplary solution of determining the reference memory cell according to the first direction and the second direction when the first direction is opposite to the second direction according to another embodiment of the present disclosure.

FIG. 6 shows an exemplary solution of determining the reference memory cell according to the first direction and the second direction when the first direction is opposite to the second direction according to another embodiment of the present disclosure.

Referring to FIG. 6, the first direction is the bottom-up direction, and the second direction is the top-down direction. The current target memory cell is located on the word line $WL_n$. The reference memory cell is a memory cell corresponding to the same vertical channel structure (e.g., trench) as the current target memory cell on the word line $WL_{n+1}$. According to the direction of the reading order (from top to bottom), the reference memory cell has been decoded, so that it may be ensured that the data on the reference physical page is correct.

Figure 7:
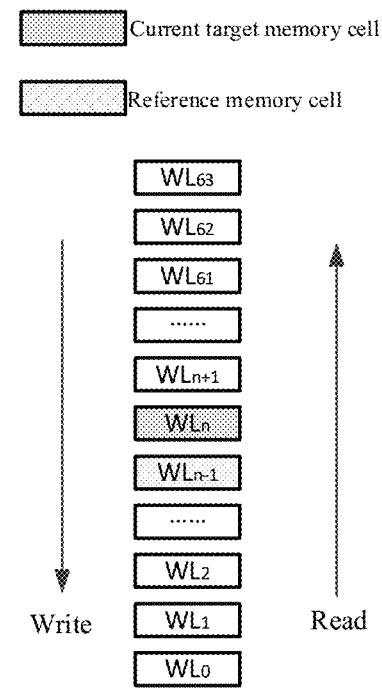
FIG. 7 shows another exemplary solution of determining the reference memory cell according to the first direction and the second direction when the first direction is opposite to the second direction according to another embodiment of the present disclosure.

FIG. 7 shows another exemplary solution of determining the reference memory cell according to the first direction and the second direction when the first direction is opposite to the second direction according to another embodiment of the present disclosure.

Referring to FIG. 7, the first direction is the top-down direction, and the second direction is the bottom-up direction. The current target memory cell is located on the word line $WL_n$. The reference memory cell is a memory cell corresponding to the same vertical channel structure (e.g., trench) as the current target memory cell on the word line $WL_{n-1}$. According to the direction of the reading order (from bottom to top), the reference memory cell has been decoded, so that it may be ensured that the data on the reference physical page is correct.

According to the embodiments of the present disclosure, when the reading order is opposite to the writing order, it is also possible to adopt the method of "referring to both sides". Determining the reference memory cell according to the first direction and the second direction includes: determining a memory cell in the previous layer of memory cell array and a memory cell in the next layer of memory cell array adjacent to the current target memory cell in the second direction as the reference memory cell when the second direction is opposite to the first direction.

Figure 8:
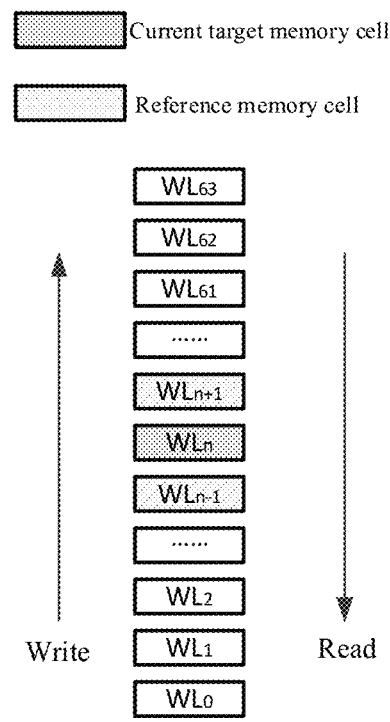
FIG. 8 shows an exemplary solution of determining the reference memory cell according to the first direction and the second direction when the first direction is opposite to the second direction according to still another embodiment of the present disclosure.

FIG. 8 shows an exemplary solution of determining the reference memory cell according to the first direction and the second direction when the first direction is opposite to the second direction according to still another embodiment of the present disclosure.

Referring to FIG. 8, the first direction is the bottom-up direction, and the second direction is the top-down direction. The current target memory cell is located on the word line $WL_n$. The reference memory cell includes memory cells corresponding to the same vertical channel structure (e.g., trench) as the current target memory cell on the word line $WL_{n-1}$ and the word line $WL_{n-1}$.

Figure 9:
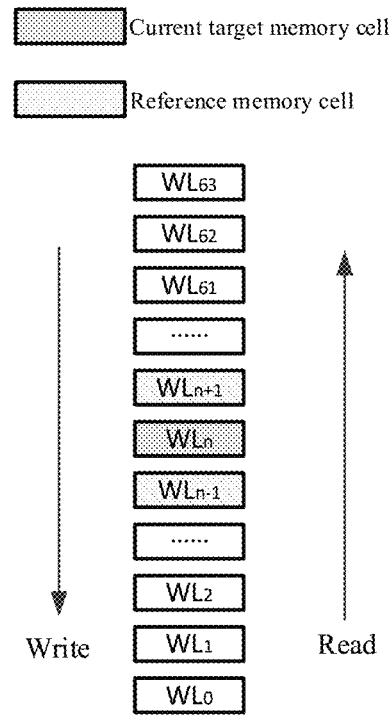
FIG. 9 shows another exemplary solution of determining the reference memory cell according to the first direction and the second direction when the first direction is opposite to the second direction according to still another embodiment of the present disclosure.

FIG. 9 shows another exemplary solution of determining the reference memory cell according to the first direction and the second direction when the first direction is opposite to the second direction according to still another embodiment of the present disclosure.

Referring to FIG. 9, the first direction is the top-down direction, and the second direction is the bottom-up direction. The current target memory cell is located on the word line $WL_n$. The reference memory cell includes memory cells corresponding to the same vertical channel structure (e.g., trench) as the current target memory cell on the word line $WL_{n-1}$ and the word line $WL_{n-1}$.

According to the embodiments of the present disclosure, in the case of referring to one side, if the reading order is consistent with the writing order, it is also possible to refer to the adjacent memory cell on the side having a less influence. Determining the reference memory cell according to the first direction and the second direction may also include: determining a memory cell in the previous layer of memory cell array adjacent to the current target memory cell in the second direction as the reference memory cell when the second direction is identical with the first direction.

Figure 10:
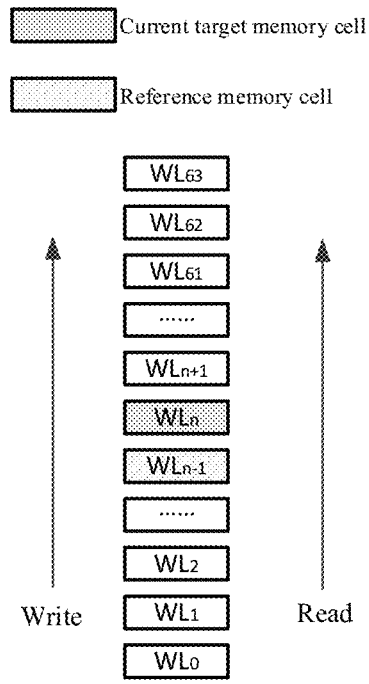
FIG. 10 shows an exemplary solution of determining the reference memory cell according to the first direction and the second direction when the first direction is identical with the second direction according to yet another embodiment of the present disclosure.

FIG. 10 shows an exemplary solution of determining the reference memory cell according to the first direction and the second direction when the first direction is identical with the second direction according to yet another embodiment of the present disclosure.

Referring to FIG. 10, the first direction is the bottom-up direction, and the second direction is also the bottom-up direction. The current target memory cell is located on the word line $WL_n$. The reference memory cell is a memory cell corresponding to the same vertical channel structure (e.g., trench) as the current target memory cell on the word line $WL_{n-1}$.

Figure 11:
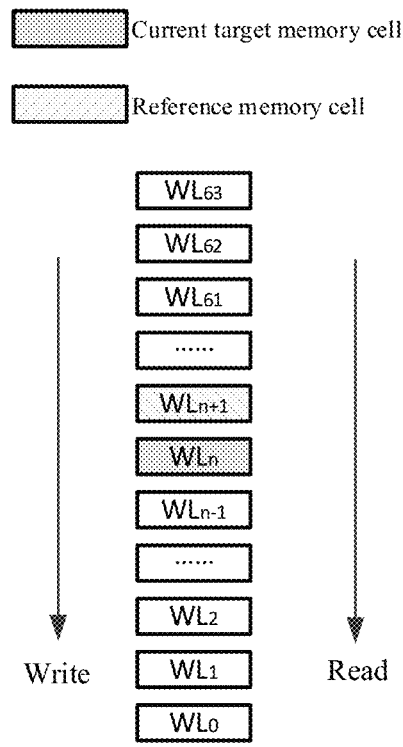
FIG. 11 shows another exemplary solution of determining the reference memory cell according to the first direction and the second direction when the first direction is identical with the second direction according to yet another embodiment of the present disclosure.

FIG. 11 shows another exemplary solution of determining the reference memory cell according to the first direction and the second direction when the first direction is identical with the second direction according to yet another embodiment of the present disclosure.

Referring to FIG. 11, the first direction is the top-down direction, and the second direction is also the top-down direction. The current target memory cell is located on the word line $WL_n$. The reference memory cell is a memory cell corresponding to the same vertical channel structure (e.g., trench) as the current target memory cell on the word line $WL_{n+1}$.

The solution of determining the reference memory cell when randomly reading will be described exemplarily below with reference to FIG. 12 to FIG. 15.

According to the embodiments of the present disclosure, determining the reference memory cell according to the first direction includes: determining a memory cell in a next layer of memory cell array adjacent to the current target memory cell in the first direction as the reference memory cell.

Figure 12:
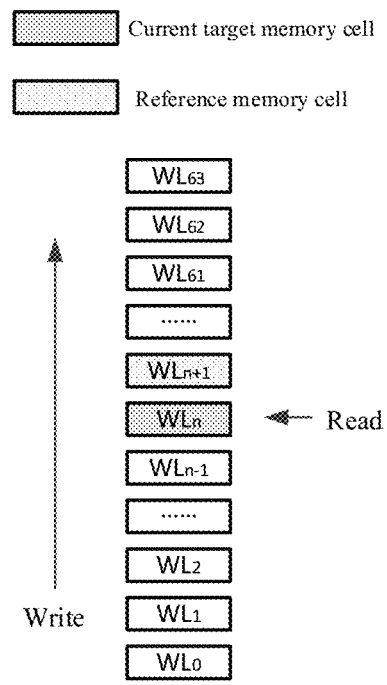
FIG. 12 shows an exemplary solution of determining the reference memory cell according to the first direction when the first direction is a bottom-up direction according to an embodiment of the present disclosure.

FIG. 12 shows an exemplary solution of determining the reference memory cell according to the first direction when the first direction is the bottom-up direction according to an embodiment of the present disclosure.

Referring to FIG. 12, the first direction is the bottom-up direction, and a random reading is performed. The current target memory cell is located on the word line $WL_n$. The reference memory cell is a memory cell corresponding to the same vertical channel structure (e.g., trench) as the current target memory cell on the word line $WL_{n+1}$.

Figure 13:
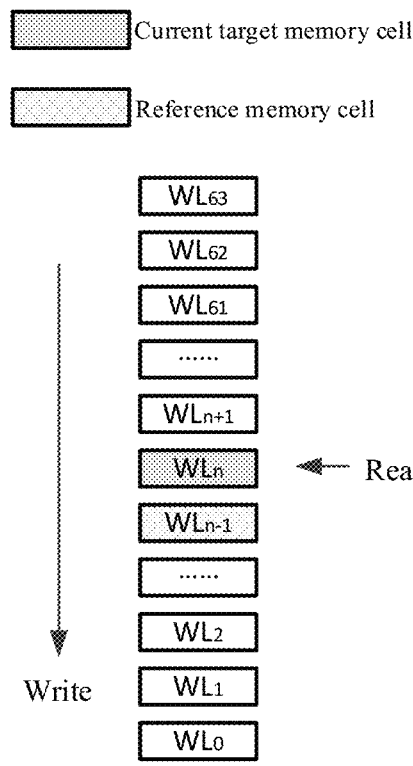
FIG. 13 shows another exemplary solution of determining the reference memory cell according to the first direction when the first direction is a top-down direction according to an embodiment of the present disclosure.

FIG. 13 shows another exemplary solution of determining the reference memory cell according to the first direction when the first direction is the top-down direction according to an embodiment of the present disclosure.

Referring to FIG. 13, the first direction is the top-down direction, and a random reading is performed. The current target memory cell is located on the word line $WL_n$. The reference memory cell is a memory cell corresponding to the same vertical channel structure (e.g., trench) as the current target memory cell on the word line $WL_{n-1}$.

According to the embodiments of the present disclosure, determining the reference memory cell according to the first direction includes: determining a memory cell in a next layer of memory cell array and a memory cell in a previous layer of memory cell array adjacent to the current target memory cell in the first direction as the reference memory cell.

Figure 14:
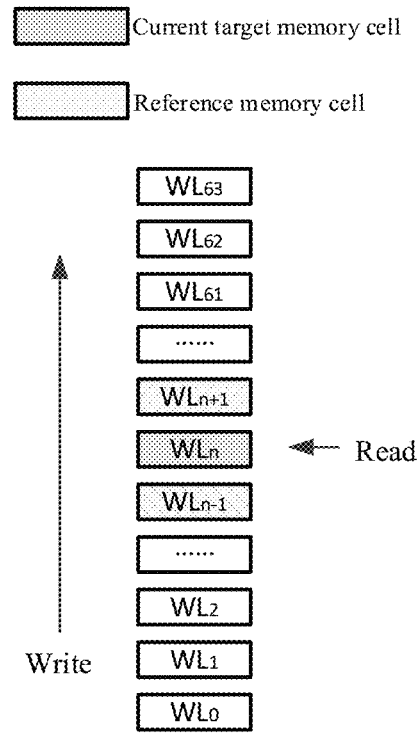
FIG. 14 shows an exemplary solution of determining the reference memory cell according to the first direction when the first direction is a bottom-up direction according to another embodiment of the present disclosure.

FIG. 14 shows an exemplary solution of determining the reference memory cell according to the first direction when the first direction is the bottom-up direction according to another embodiment of the present disclosure.

Referring to FIG. 14, the first direction is the bottom-up direction, and a random reading is performed. The current target memory cell is located on the word line $WL_n$. The reference memory cell includes the memory cells corresponding to the same vertical channel structure (e.g., trench) as the current target memory cell on the word line $WL_{n+1}$ and the word line $WL_{n-1}$.

Figure 15:
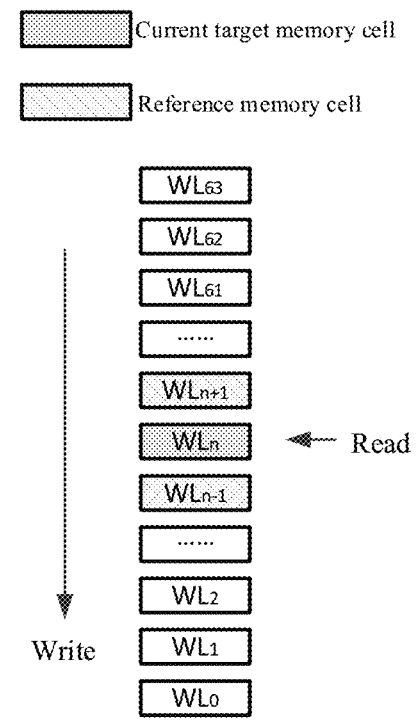
FIG. 15 shows another exemplary solution of determining the reference memory cell according to the first direction when the first direction is a top-down direction according to another embodiment of the present disclosure.

FIG. 15 shows another exemplary solution of determining the reference memory cell according to the first direction when the first direction is the top-down direction according to another embodiment of the present disclosure.

Referring to FIG. 15, the first direction is the top-down direction, and a random reading is performed. The current target memory cell is located on the word line $WL_n$. The reference memory cell includes the memory cells corresponding to the same vertical channel structure (e.g., trench) as the current target memory cell on the word line $WL_{n-1}$ and the word line $WL_{n+1}$.

A comparison between the method of performing soft decoding by using the LLR value obtained by the read-write method for the LEPS soft decoding estimation in the embodiments of the present disclosure and the existing decoding method in terms of the error correction ability, the number of iterations, the bit error rate and other performance will be described below in conjunction with FIG. 16 to FIG. 18.

Figure 16:
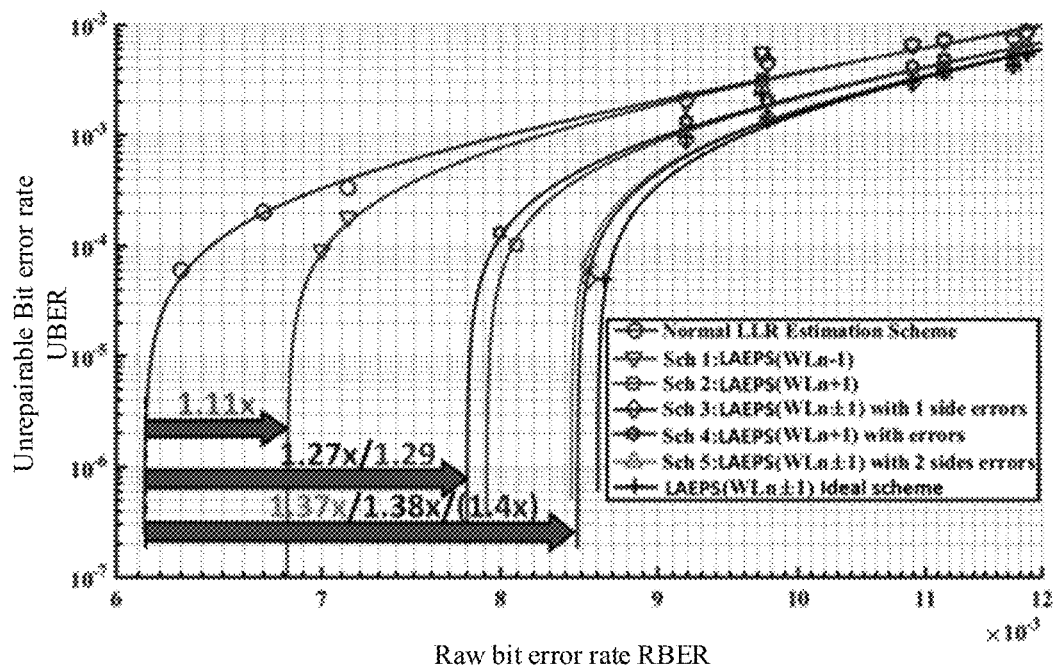
FIG. 16 shows a comparison diagram between the method of performing soft decoding by using the read-write method for the LEPS soft decoding estimation in the embodiments of the present disclosure and the existing decoding method in terms of the error correction ability.

FIG. 16 shows a comparison diagram between the method of performing soft decoding by using the read-write method for the LEPS soft decoding estimation in the embodiments of the present disclosure and the existing decoding method in terms of the error correction ability. FIG. 17 shows a comparison diagram between the method of performing soft decoding by using the read-write method for the LEPS soft decoding estimation in the embodiments of the present disclosure and the existing decoding method in terms of the number of iterations. FIG. 18 shows a comparison diagram between the method of performing soft decoding by using the read-write method for the LEPS soft decoding estimation in the embodiments of the present disclosure and the existing decoding method in terms of the bit error rate.

Figure 17:
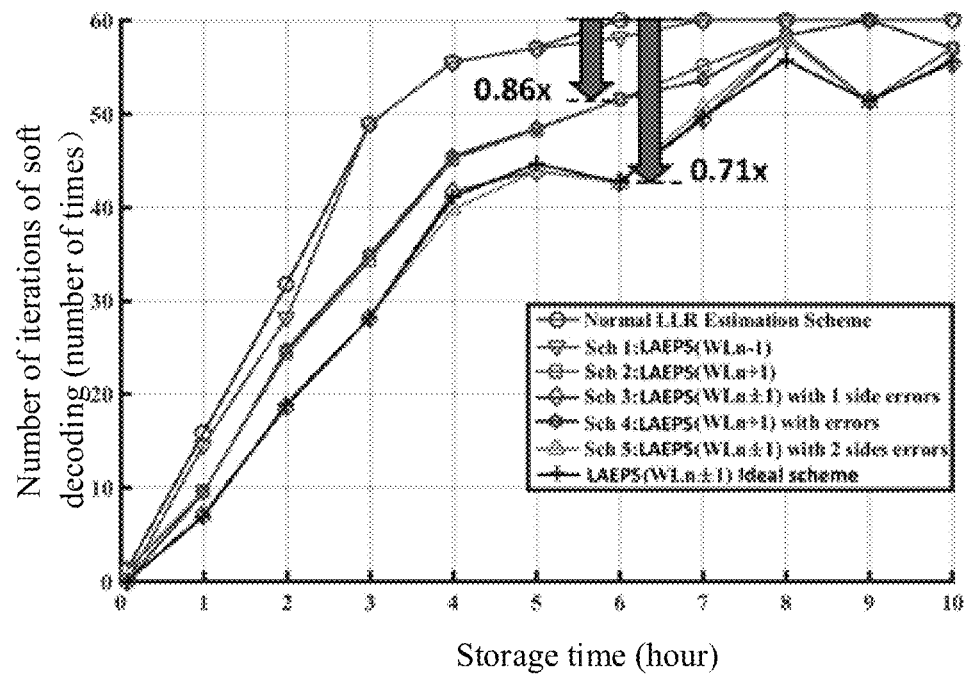
FIG. 17 shows a comparison diagram between the method of performing soft decoding by using the read-write method for the LEPS soft decoding estimation in the embodiments of the present disclosure and the existing decoding method in terms of the number of iterations.
Figure 18:
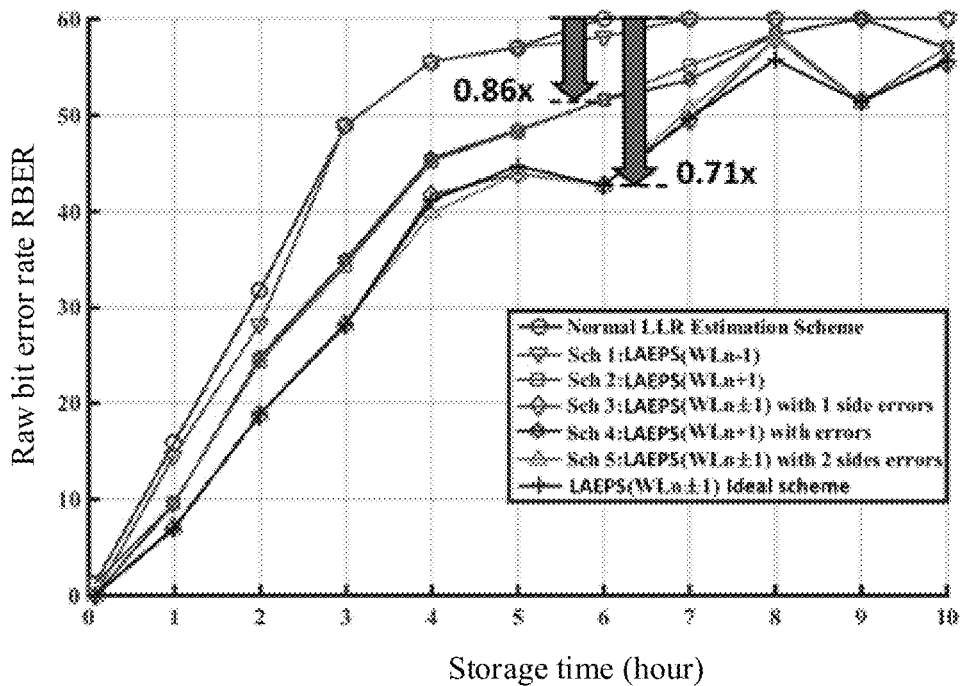
FIG. 18 shows a comparison diagram between the method of performing soft decoding by using the read-write method for the LEPS soft decoding estimation in the embodiments of the present disclosure and the existing decoding method in terms of the bit error rate.

In FIG. 16 to FIG. 18, LEPS($WL_{n-1}$) corresponds to the structure shown in FIG. 10, LEPS($WL_{n+1}$) corresponds to the structure shown in FIG. 6, LEPS($WL_{n\pm1}$) with 1 side errors corresponds to the structure shown in FIG. 8, LEPS ($WL_{n+1}$) with errors corresponds to the structure shown in FIG. 12, LEPS($WL_{n\pm1}$) with 2 side errors corresponds to the structure shown in FIG. 14, and LEPS($WL_{n\pm1}$) ideal scheme represents an ideal curve. As shown by the curves in FIG. 16 to FIG. 18, according to the read-write method of the embodiments of the present disclosure, when the reading order is identical with the writing order, for example, when writing in the normal sequence and reading in the normal sequence, there is little difference between the method of referring to the word line $WL_{n-1}$ and the traditional error correction algorithm in terms of the error correction ability, the number of iterations and the bit error rate; and when writing in the normal sequence and reading in the normal sequence, an error on $WL_{n+1}$ has a little influence on the error correction ability. When the reading order is inconsistent with the writing order, for example, in a case of writing in the normal sequence and reading in the reverse sequence, the obtained error correction performance has little difference from the error correction performance obtained in a case of writing the normal sequence and reading randomly. Under these two read-write methods, referring to the word line $WL_{n+1}$ may obviously improve the error correction ability, reduce the number of iterations and the bit error rate, and the error correction performance is improved. When the writing direction is the bottom-up (or top-down) direction, referring to the word line $WL_{n+1}$ may further improve the error correction performance compared with referring to the word line $WL_{n+1}$.

Here, taking the method of sequentially writing from bottom to top as an example, the word line $WL_{n+1}$ has a relatively greater influence, so that the error correction ability is improved; if the writing order is changed to from top to bottom, the word line $WL_{n-1}$ may have a relatively greater influence. After changing the direction of sequential writing, the corresponding case may be changed according to the above-mentioned examples. For example, the performance of the structure shown in FIG. 8 is consistent with that of the structure shown in FIG. 9, and the performance of the structure shown in FIG. 10 is consistent with that of the structure shown in FIG. 11.

A second exemplary embodiment of the present disclosure provides a read-write apparatus for an LEPS soft decoding estimation. The above-mentioned read-write apparatus is used to perform a read-write operation on a three-dimensional memory.

In such embodiments, the three-dimensional memory includes: a plurality of vertical channel structures arranged perpendicular to a substrate, and a plurality of layers of memory cell arrays intersecting with the plurality of vertical channel structures and arranged parallel to each other, wherein a memory cell in an upper layer of memory cell array and a memory cell at a corresponding position in a lower layer of memory cell array are connected to a same vertical channel structure.

In an embodiment, the memory may be a computer-readable storage medium, which may be any tangible medium containing or storing a program, and the program may be used by or in combination with an instruction execution system, apparatus or device.

Figure 19:
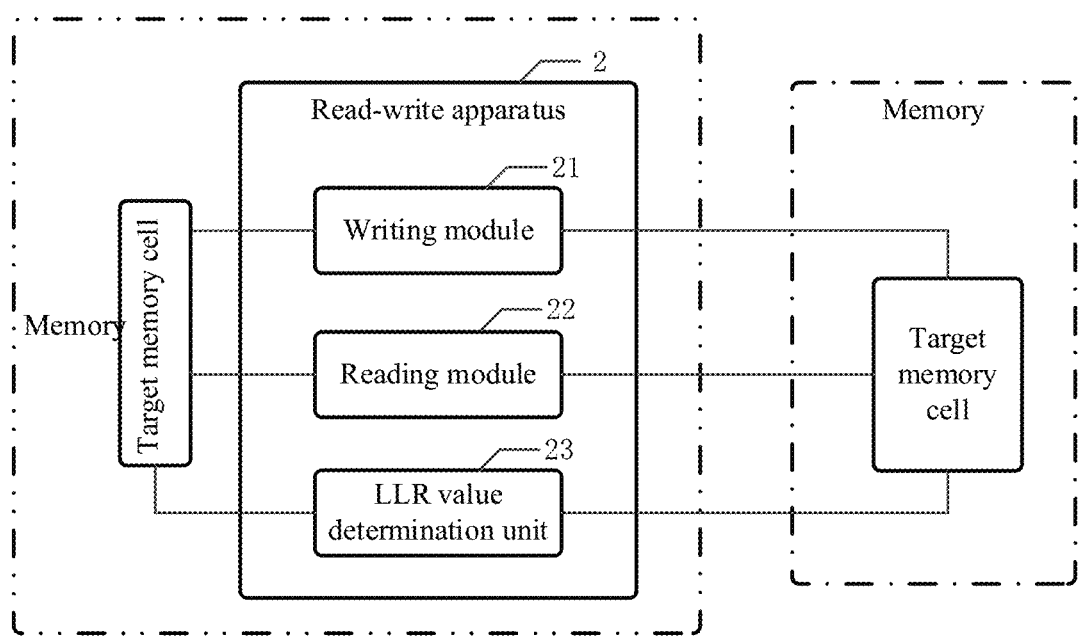
FIG. 19 shows a structural block diagram of a read-write apparatus for an LEPS soft decoding estimation according to an embodiment of the present disclosure.

FIG. 19 shows a structural block diagram of a read-write apparatus for an LEPS soft decoding estimation according to an embodiment of the present disclosure.

Referring to FIG. 19, a read-write apparatus 2 includes: a writing module 21, a reading module 22, and an LLR value determination unit 23.

The three-dimensional memory in the embodiments is used as an implementation object of the above-mentioned read-write apparatus to implement a read-write operation. The read-write apparatus and the three-dimensional memory may be two independent entities, as shown by single-dot dash lines in FIG. 19; the read-write apparatus may also be located inside the three-dimensional memory, and a read-write operation may be performed in the three-dimensional memory. The read-write operation may be controlled by a controller, as shown by double-dot dash lines in FIG. 19.

The operations of steps S11, S12, S13 and S14 are performed on the three-dimensional memory based on the above-mentioned writing module 21, reading module 22 and LLR value determining unit 23.

The writing module 21 is used to sequentially write, in a first direction, a code word obtained by information-bit encoding into a target memory cell in each layer of memory cell array in the three-dimensional memory. The first direction includes a bottom-up direction or a top-down direction.

The reading module 22 is used to randomly read the target memory cell in each layer of memory cell array, or sequentially read the target memory cell in each layer of memory cell array in a second direction. The second direction is identical with or opposite to the first direction.

The comprehensive distribution state of the current target memory cell is determined according to an influence of a reference memory cell corresponding to the same vertical channel structure as the current target memory cell on a distribution state of the current target memory cell. When the target memory cell in each layer of memory cell array is randomly read, the reference memory cell is determined according to the first direction. When the target memory cell in each layer of memory cell array is sequentially read in the second direction, the reference memory cell is determined according to the first direction and the second direction. An input of the pre-established LLR table includes the storage time, the threshold voltage partition and the comprehensive distribution state, and an output of the pre-established LLR table is the LLR value.

The LLR value determination unit 23 is used to determine an LLR value of a current target memory cell according to a storage time corresponding to the current target memory cell when reading, a threshold voltage partition corresponding to the current target memory cell when reading, a comprehensive distribution state corresponding to the current target memory cell when reading, and a pre-established LLR table, so as to perform a soft decoding operation on the code word in the current target memory cell based on the LLR value of the current target memory cell.

The operation of pre-establishing the LLR table may be implemented on the three-dimensional memory in advance, and the established LLR is stored in a storage module. The storage module may be located on the three-dimensional memory, or may also be located in a storage device other than the three-dimensional memory or in a server. The read-write apparatus may call the LLR table from the storage module.

A third exemplary embodiment of the present disclosure provides an electronic device. The electronic device includes: one or more processors; and a storage device for storing one or more programs. When executed by the one or more processors, the one or more programs may cause the one or more processors to implement any one of the above-mentioned read-write methods.

The electronic device includes: computers, mobile phones, smart speakers, wearable smart devices, robots or smart chips, etc.

In an embodiment, the electronic device and the above-mentioned three-dimensional memory may be two independent entities, for example, the electronic device is a computer, and the above-mentioned three-dimensional memory is a U disk. The above-mentioned three-dimensional memory may also be used as a component of the electronic device, for example, the electronic device is a computer, and the above-mentioned memory is a NAND flash memory chip inside the computer.

The method flow according to the embodiments of the present disclosure may be implemented as a computer software program. The writing module 21, the reading module 22 and the LLR value determination unit 23 may be computer program instructions. For example, the embodiments of the present disclosure include a computer program product, which includes a computer program carried on a computer-readable storage medium, where the computer program contains program codes for executing the methods shown in the flowcharts.

In summary, the embodiments of the present disclosure provide a read-write method and apparatus for an LEPS soft decoding estimation, and an electronic device. When selecting the reference memory cell that has an influence, such as a lateral diffusion effect or a capacitive coupling effect, etc. on the comprehensive distribution state of the current target memory cell, an influence of the writing order and the reading order on the selection of the reference memory cell is taken into account, and the reference memory cell is determined based on the writing order and the reading manner, so as to obtain the LLR value corresponding to the comprehensive distribution state of the currently read memory cell based on the influence of the above-mentioned reference memory cell to perform a soft decoding operation, so that the error correction ability may be improved, and the number of iterations may be reduced. In addition, a trade-off may be performed between an error correction ability, a read-write efficiency and a memory occupation, so as to improve an overall performance of the memory.

In the embodiments of the present disclosure, each block in the block diagrams or flowcharts and a combination of blocks in the block diagrams or flowcharts may be implemented by a dedicated hardware-based system that performs specified functions or operations, or may be implemented by a combination of dedicated hardware and computer instructions.

The "first", "second" and similar words used in the present disclosure do not indicate any order, quantity or importance, but are merely used to distinguish different components. The execution order exemplarily described in the flowcharts and the embodiments is not exclusive, and other logical execution orders are within the protection scope of the present disclosure.

The objectives, technical solutions and beneficial effects of the present disclosure are further described in detail in the above-mentioned specific embodiments. It should be understood that the above descriptions are merely specific embodiments of the present disclosure, and are not intended to limit the present disclosure. Any modifications, equivalent replacements, improvements, etc. made within the spirit and principles of the present disclosure shall be contained within the protection scope of the present disclosure.

The invention claimed is:

1. A read-write method for an LEPS soft decoding estimation, wherein the read-write method is applicable to a three-dimensional memory; the three-dimensional memory comprises: a plurality of vertical channel structures arranged perpendicular to a substrate, and a plurality of layers of memory cell arrays intersecting with the plurality of vertical channel structures and arranged parallel to each other, wherein a memory cell in an upper layer of memory cell array and a memory cell at a corresponding position in a lower layer of memory cell array are connected to a same vertical channel structure; the read-write method comprises:
   sequentially writing, in a first direction, a code word obtained by information-bit encoding into a target memory cell in each layer of memory cell array in the three-dimensional memory, wherein the first direction comprises a bottom-up direction or a top-down direction;
   randomly reading the target memory cell in each layer of memory cell array, or sequentially reading the target memory cell in each layer of memory cell array in a second direction, wherein the second direction is identical with or opposite to the first direction; and
   determining an LLR (log likelihood ratio) value of a current target memory cell according to a storage time corresponding to the current target memory cell when reading, a threshold voltage partition corresponding to the current target memory cell when reading, a comprehensive distribution state corresponding to the current target memory cell when reading, and a pre-established LLR table, so as to perform a soft decoding operation on the code word in the current target memory cell based on the LLR value of the current target memory cell,
   wherein the comprehensive distribution state of the current target memory cell is determined according to an influence of a reference memory cell corresponding to the same vertical channel structure as the current target memory cell on a distribution state of the current target memory cell; when the target memory cell in each layer of memory cell array is randomly read, the reference memory cell is determined according to the first direction; when the target memory cell in each layer of memory cell array is sequentially read in the second direction, the reference memory cell is determined according to the first direction and the second direction; an input of the pre-established LLR table comprises the storage time, the threshold voltage partition and the comprehensive distribution state, and an output of the pre-established LLR table is the LLR value.

2. The read-write method according to claim 1, wherein the determining the reference memory cell according to the first direction and the second direction comprises:
   determining a memory cell in a next layer of memory cell array adjacent to the current target memory cell in the second direction as the reference memory cell when the second direction is identical with the first direction.

3. The read-write method according to claim 1, wherein the determining the reference memory cell according to the first direction and the second direction comprises:
   determining a memory cell in a previous layer of memory cell array adjacent to the current target memory cell in the second direction as the reference memory cell when the second direction is opposite to the first direction.

4. The read-write method according to claim 1, wherein the determining the reference memory cell according to the first direction and the second direction comprises:

determining a memory cell in a previous layer of memory cell array adjacent to the current target memory cell in the second direction and a memory cell in a next layer of memory cell array adjacent to the current target memory cell in the second direction as the reference memory cell when the second direction is opposite to the first direction.

5. The read-write method according to claim 1, wherein the determining the reference memory cell according to the first direction and the second direction comprises:
determining a memory cell in a previous layer of memory cell array adjacent to the current target memory cell in the second direction as the reference memory cell when the second direction is identical with the first direction.

6. The read-write method according to claim 1, wherein the determining the reference memory cell according to the first direction comprises:
determining a memory cell in a next layer of memory cell array adjacent to the current target memory cell in the first direction as the reference memory cell.

7. The read-write method according to claim 1, wherein the determining the reference memory cell according to the first direction comprises:
determining a memory cell in a next layer of memory cell array adjacent to the current target memory cell in the first direction and a memory cell in a previous layer of memory cell array adjacent to the current target memory cell in the first direction as the reference memory cell.

8. The read-write method according to claim 1, wherein the LLR table is pre-established by:
performing a read test on a memory to: acquire, at a specified storage time, a threshold voltage distribution and a distribution state of a current target memory cell of which an exact code is known and a threshold voltage distribution and a distribution state of a memory cell adjacent to the current target memory cell, determine a comprehensive distribution state of the current target memory cell according to an influence of the memory cell adjacent to the current memory cell on the distribution state of the current target memory cell, and calculate LLR values of different threshold voltage partitions according to the comprehensive distribution state; and
acquiring corresponding threshold voltage partitions and comprehensive distribution states at different storage times, so as to obtain the LLR table of which the input comprises the storage time, the threshold voltage partition and the comprehensive distribution state and the output is the LLR value.

9. An electronic device, comprising:
one or more processors; and
a storage means configured to store one or more programs,
wherein the one or more programs are configured to, when being executed by the one or more processors, cause the one or more processors to implement the read-write method of claim 1.

10. A read-write apparatus for an LEPS soft decoding estimation, wherein the read-write apparatus is configured to perform a read-write operation on a three-dimensional memory; the three-dimensional memory comprises: a plurality of vertical channel structures arranged perpendicular to a substrate, and a plurality of layers of memory cell arrays intersecting with the plurality of vertical channel structures and arranged parallel to each other, wherein a memory cell in an upper layer of memory cell array and a memory cell at a corresponding position in a lower layer of memory cell array are connected to a same vertical channel structure; the read-write apparatus comprises:
a writing module configured to sequentially write, in a first direction, a code word obtained by information-bit encoding into a target memory cell in each layer of memory cell array in the three-dimensional memory, wherein the first direction comprises a bottom-up direction or a top-down direction;
a reading module configured to randomly read the target memory cell in each layer of memory cell array, or sequentially read the target memory cell in each layer of memory cell array in a second direction, wherein the second direction is identical with or opposite to the first direction; and
an LLR value determination unit configured to determine an LLR value of a current target memory cell according to a storage time corresponding to the current target memory cell when reading, a threshold voltage partition corresponding to the current target memory cell when reading, a comprehensive distribution state corresponding to the current target memory cell when reading, and a pre-established LLR table, so as to perform a soft decoding operation on the code word in the current target memory cell based on the LLR value of the current target memory cell,
wherein the comprehensive distribution state of the current target memory cell is determined according to an influence of a reference memory cell corresponding to the same vertical channel structure as the current target memory cell on a distribution state of the current target memory cell; when the target memory cell in each layer of memory cell array is randomly read, the reference memory cell is determined according to the first direction; when the target memory cell in each layer of memory cell array is sequentially read in the second direction, the reference memory cell is determined according to the first direction and the second direction; an input of the pre-established LLR table comprises the storage time, the threshold voltage partition and the comprehensive distribution state, and an output of the pre-established LLR table is the LLR value.

* * * * *